United States Patent
Nakata

(10) Patent No.: US 9,704,813 B2
(45) Date of Patent: Jul. 11, 2017

(54) METHOD OF MANUFACTURING SEMICONDUCTOR DEVICE

(71) Applicant: Mitsubishi Electric Corporation, Tokyo (JP)

(72) Inventor: Kazunari Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/911,190

(22) PCT Filed: Nov. 26, 2013

(86) PCT No.: PCT/JP2013/081754
§ 371 (c)(1),
(2) Date: Feb. 9, 2016

(87) PCT Pub. No.: WO2015/079489
PCT Pub. Date: Jun. 4, 2015

(65) Prior Publication Data
US 2016/0197046 A1    Jul. 7, 2016

(51) Int. Cl.
*H01L 23/00*    (2006.01)
*H01L 21/304*    (2006.01)
(Continued)

(52) U.S. Cl.
CPC .......... *H01L 23/562* (2013.01); *B24B 37/042* (2013.01); *H01L 21/02057* (2013.01);
(Continued)

(58) Field of Classification Search
CPC ............ H01L 23/562; H01L 21/02057; H01L 21/304; H01L 21/3043; B24B 37/042
See application file for complete search history.

(56) References Cited

U.S. PATENT DOCUMENTS

2003/0215985 A1    11/2003    Kouno et al.
2007/0007247 A1    1/2007    Sekiya
(Continued)

FOREIGN PATENT DOCUMENTS

JP    2003-332271 A    11/2003
JP    2007-019379 A    1/2007
(Continued)

OTHER PUBLICATIONS

International Search Report, PCT/JP2013/081754 mailed Feb. 25, 2014.
(Continued)

*Primary Examiner* — Duy Deo
(74) *Attorney, Agent, or Firm* — Studebaker & Brackett PC

(57) ABSTRACT

A device region (17) is formed at a central part of a semiconductor wafer (2) and a ring-shaped reinforced portion (18) which is thicker than the device region (17) is formed on an outer circumference of the device region (17). After forming the device region (17) and the ring-shaped reinforced portion (18), the semiconductor wafer (2) is subjected to wet treatment. After the wet treatment, the semiconductor wafer (2) is rotated and dried. A center position of the semiconductor wafer (2) is different from a center position of the ring-shaped reinforced portion (18).

7 Claims, 6 Drawing Sheets

(51) Int. Cl.
    *B24B 37/04* (2012.01)
    *H01L 21/02* (2006.01)
(52) U.S. Cl.
    CPC ........ *H01L 21/304* (2013.01); *H01L 21/3043* (2013.01); *H01L 2924/0002* (2013.01)

(56) References Cited

U.S. PATENT DOCUMENTS

| | | | |
|---|---|---|---|
| 2008/0076334 A1* | 3/2008 | Yoshida | B24B 1/00 451/177 |
| 2008/0318497 A1* | 12/2008 | Kimura | B24B 37/04 451/54 |
| 2009/0004859 A1* | 1/2009 | Kimura | H01L 21/304 438/691 |
| 2009/0186563 A1 | 7/2009 | Takahashi et al. | |
| 2013/0001766 A1 | 1/2013 | Takyu et al. | |

FOREIGN PATENT DOCUMENTS

| | | |
|---|---|---|
| JP | 2008-124292 A | 5/2008 |
| JP | 2009-105194 A | 5/2009 |
| JP | 2009-176896 A | 8/2009 |
| JP | 2009-259941 A | 11/2009 |
| JP | 2012-009662 A | 1/2010 |
| JP | 2012-190930 A | 10/2012 |
| JP | 2013-012690 A | 1/2013 |

OTHER PUBLICATIONS

Notification of Transmittal of Copies of Translation of the International Preliminary Report on Patentability and Translation of Written Opinion of the International Searching Authority; PCT/JP2013/081754 issued on Jun. 9, 2016.

An Office Action; "Notice of Reasons for Rejection," issued by the Japanese Patent Office on Sep. 20, 2016, which corresponds to Japanese Patent Application No. 2015-550228 and is related to U.S. Appl. No. 14/911,190; with English language partial translation.

An Office Action issued by the Korean Patent Office on Dec. 13, 2016, which corresponds to Korean Patent Application No. 10-2016-7013984 and is related to U.S. Appl. No. 14/911,190; with English language partial translation.

* cited by examiner

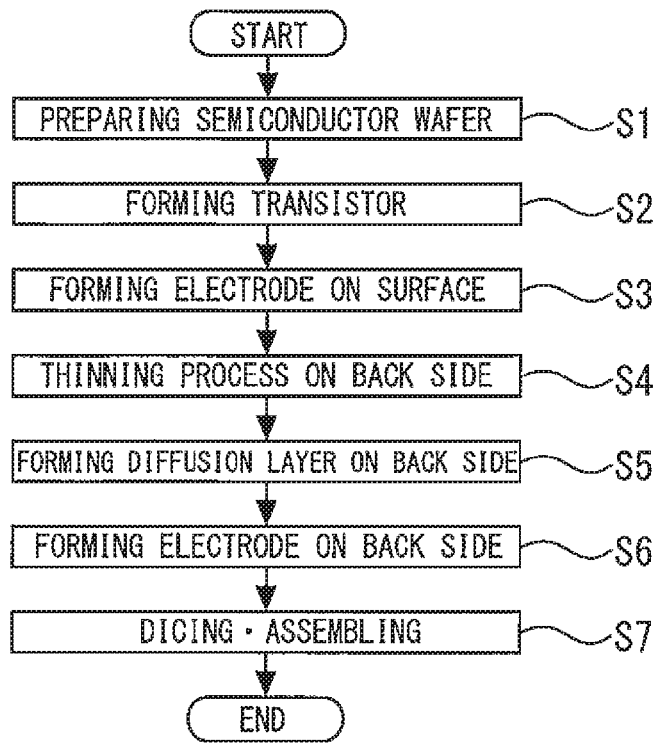
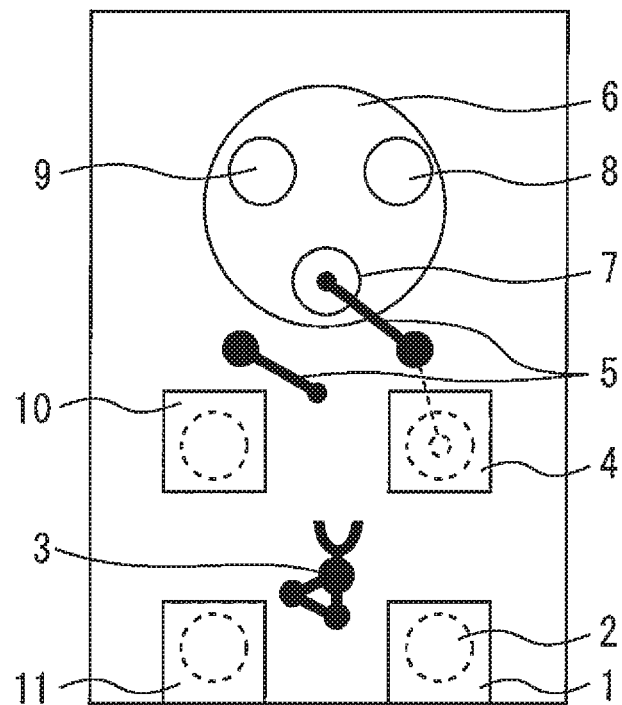

Fig. 9
(a)
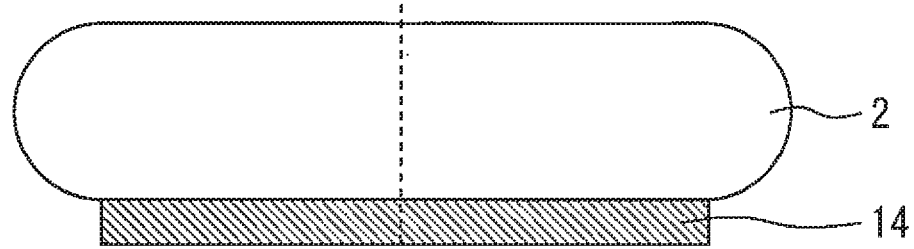
(b)
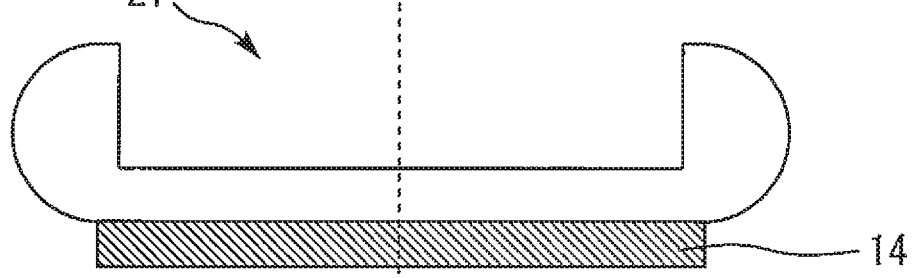
(c)
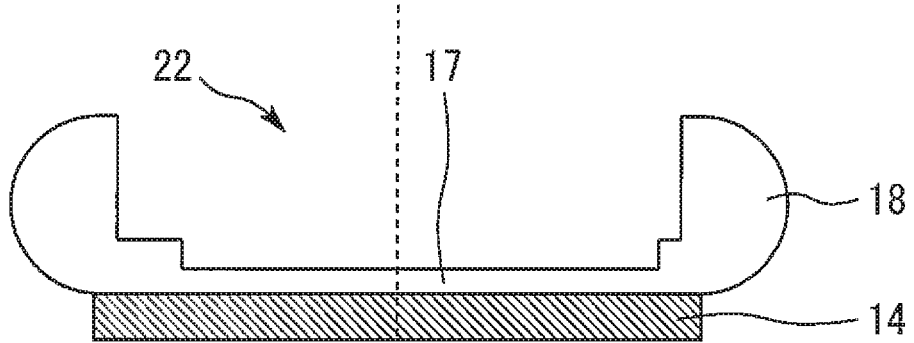

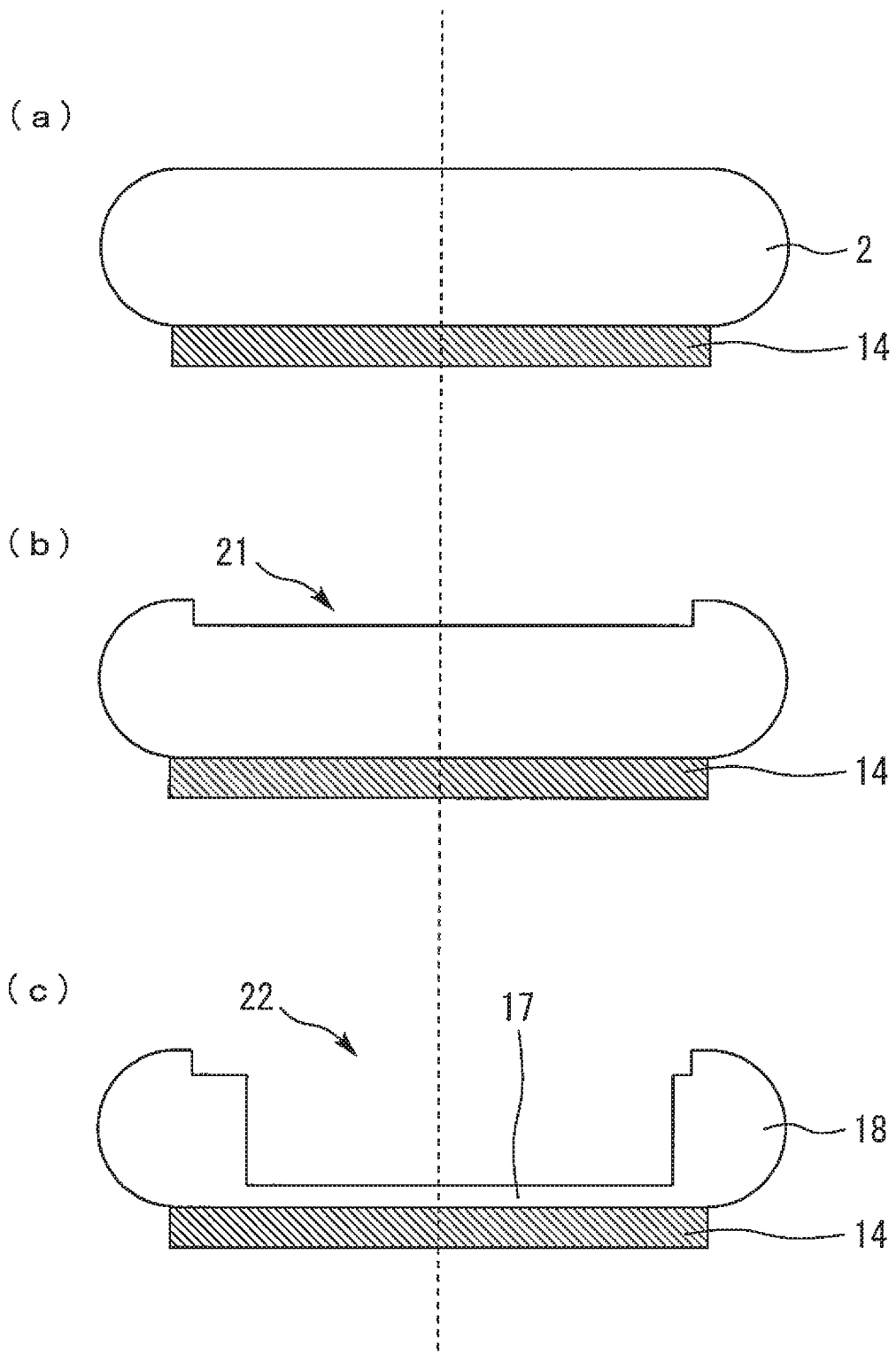

METHOD OF MANUFACTURING SEMICONDUCTOR DEVICE

TECHNICAL FIELD

The present invention relates to a method of manufacturing a semiconductor device capable of preventing foreign substances from staying behind after drying and restraining the generation of stains.

BACKGROUND ART

In manufacturing semiconductor devices, LSI packages are being assembled in increasingly higher densities through three-dimensional mounting or the like, and wafer thicknesses have been reduced to the order of 25 μm upon completion of processes. Furthermore, power devices such as IGBT (insulated gate bipolar transistor) and MOSFET (MOS field-effect transistor) are widely used as inverter circuits for industrial motors and automobile motors or the like, power supply apparatuses for large capacity servers and semiconductor switches for uninterruptible power supply apparatuses or the like.

These power semiconductor devices are manufactured by thinning semiconductor wafers to improve energization performance typified by on-characteristics or the like. In recent years, semiconductor devices are manufactured using an ultra-thin wafer process that reduces the thickness of a wafer material prepared using an FZ (floating zone) method down to the order of 50 μm to improve cost/characteristic aspects.

Generally, a wafer thinning process applies grinding by back grinding or polishing and wet etching or dry etching to remove processing distortion generated in mechanical polishing, and then forms a diffusion layer on the back side through ion implantation or heat treatment and forms electrodes using a sputtering method or the like. In such a situation, wafer cracking occurs more frequently during processing on the back side of the wafer.

Thus, there is a proposal of a processing method that processes only a central part of a wafer while causing a peripheral portion of the wafer to remain thick (e.g., see Patent Literature 1). Using a ribbed wafer in which such a rib structure is formed drastically reduces warpage of the wafer and facilitates a wafer transfer by a process apparatus. Moreover, this drastically increases the strength of the wafer and reduces cracking or chipping of the wafer while handling the wafer. Moreover, there is a proposal of a method whereby grinding water made of carbon dioxide and pure water during a grinding process is supplied to such a ribbed wafer to thereby prevent charging of the grinding water and prevent adhesion of foreign substances to the grinding surface (e.g., see Patent Literature 2). In transferring the ribbed wafer, there is a proposal of a method of preventing adhesion of foreign substances by tilting the inner circumferential wall of the rib into a reverse tapered shape and supporting the side wall from inside (e.g., see Patent Literature 3).

CITATION LIST

Patent Literature

Patent Literature 1: Japanese Patent Application Laid-Open No. 2007-19379
Patent Literature 2: Japanese Patent Application Laid-Open No. 2012-9662
Patent Literature 3: Japanese Patent Application Laid-Open No. 2012-190930

SUMMARY OF INVENTION

Technical Problem

The prior art that adds carbon dioxide to pure water can prevent charging but has a problem that foreign substances stay behind in the central part of the wafer after drying and stains are generated. On the other hand, the prior art that tilts the inner circumferential wall of the rib into a reverse tapered shape never directly touches the grinding surface, and can thereby reduce the number of foreign substances. However, since the ribbed portion touches the transport apparatus, there is a problem that foreign substances are generated from the contacting portion. Moreover, since the inner circumferential wall of the rib is reverse tapered, once foreign substances adhere to the thinned portion, it is difficult to remove the foreign substances.

The present invention has been implemented to solve the above-described problems and it is an object of the present invention to provide a method of manufacturing a semiconductor device capable of preventing foreign substances from staying behind after drying and restraining the generation of stains.

Means for Solving the Problems

A method of manufacturing a semiconductor device according to the present invention includes: forming a device region at a central part of a semiconductor wafer and a ring-shaped reinforced portion which is thicker than the device region on an outer circumference of the device region; after forming the device region and the ring-shaped reinforced portion, subjecting the semiconductor wafer to wet treatment; and after the wet treatment, rotating and drying the semiconductor wafer, wherein a center position of the semiconductor wafer is different from a center position of the ring-shaped reinforced portion.

Advantageous Effects of Invention

In the present invention, the center position of the semiconductor wafer is different from the center position of the ring-shaped reinforced portion. Therefore, water content can be efficiently drained when rotating and drying the semiconductor wafer. As a result, it is possible to prevent foreign substances from staying behind after drying and restrain the generation of stains.

BRIEF DESCRIPTION OF THE DRAWINGS

FIG. 1 is a flowchart of a method of manufacturing a semiconductor device according to Embodiment 1 of the present invention.
FIG. 2 is a top view illustrating a back grinder according to Embodiment 1 of the present invention.

FIG. 9 is a cross-sectional view illustrating a method of manufacturing a semiconductor device according to Embodiment 2 of the present invention.

FIG. 10 is a cross-sectional view illustrating a method of manufacturing a semiconductor device according to Embodiment 3 of the present invention.

DESCRIPTION OF EMBODIMENTS

Figure 3:
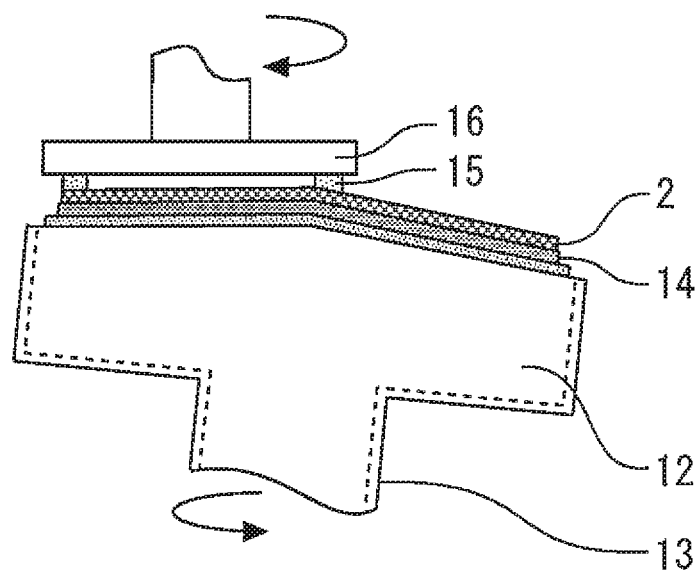
FIG. 3 is a side view illustrating a grinding process using the uniaxial or biaxial grinding stage.

A method of manufacturing a semiconductor device according to the embodiments of the present invention will be described with reference to the drawings. The same components will be denoted by the same symbols, and the repeated description thereof may be omitted.

Embodiment 1

FIG. 1 is a flowchart of a method of manufacturing a semiconductor device according to Embodiment 1 of the present invention. Here, a vertical type semiconductor device is manufactured as the semiconductor device.

First, an n-type semiconductor wafer is prepared, for example (step S1). Next, a p-type or n-type impurity is introduced into a surface (first main surface) of the semiconductor wafer through ion implantation to form a transistor having a pn junction. A gate electrode is formed using polysilicon or the like (step S2). Next, an emitter electrode and a gate wiring to draw the gate electrode out are formed on the surface using a metal material such as aluminum (step S3).

Next, the back side (second main surface) of the semiconductor wafer is subjected to a thinning process by back grinding using a grinding stone (step S4). Forming a rib structure in this case drastically reduces warpage of the semiconductor wafer and facilitates wafer transfer by a process apparatus. Moreover, the strength of the semiconductor wafer drastically increases, making it possible to reduce cracking or chipping of the semiconductor wafer when handling the semiconductor wafer.

Next, an impurity is introduced into the back side through ion implantation, the impurity is activated using a diffusion furnace or laser and a diffusion layer is formed (step S5). Next, a collector electrode for extracting electricity to the outside and a junction layer for making a connection with a circuit substrate are formed on the back side (step S6). More specifically, the collector electrode made of aluminum and the junction layer made of nickel for connection with solder are formed in order from the back side. A metal material such as titanium or vanadium for preventing diffusion between metals is used between the collector electrode and the junction layer. When the nickel surface is oxidized, wettability with the solder deteriorates, preventing reliable junction, and so a metal which is non-reactive with outside such as gold or silver is used for the nickel surface as a protective film.

Lastly, a plurality of the semiconductor devices formed on the semiconductor wafer are divided through dicing along scheduled division lines. After that, the diced semiconductor devices are assembled (step S7).

FIG. 2 is a top view illustrating a back grinder according to Embodiment 1 of the present invention. A semiconductor wafer 2 set in a wafer cassette 1 is transferred to an alignment mechanism 4 by a transfer robot 3. After that, for example, a peripheral position of the wafer is measured to thereby obtain the central position of the semiconductor wafer, the central position of the chuck is shifted by a predetermined amount and the semiconductor wafer is moved to a wafer transfer section 7 of a grinding processing stage 6 using a transfer arm 5. After that, the grinding processing stage 6 is rotated counterclockwise with respect to the surface of the sheet and moved to the position of a uniaxial grinding stage 8. The uniaxial grinding stage performs a predetermined amount of grinding. The grinding processing stage 6 is further rotated counterclockwise with respect to the surface of the sheet and moved to a biaxial grinding stage 9. The biaxial grinding stage also performs a predetermined amount of grinding as in the case of the uniaxial grinding stage. After being cleaned by a wafer cleaning mechanism 10, the semiconductor wafer 2 is accommodated in a wafer cassette 11.

Figure 4:
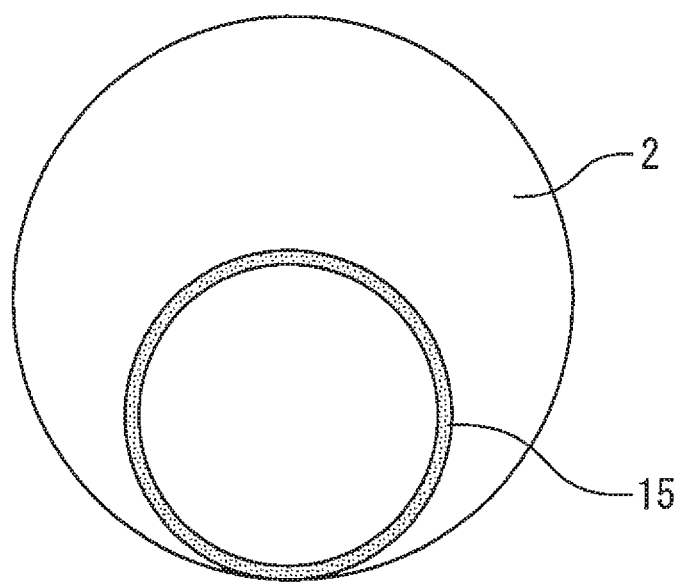
FIG. 4 is a top view illustrating a positional relationship between the semiconductor wafer and the grinding stone.

FIG. 3 is a side view illustrating a grinding process using the uniaxial or biaxial grinding stage. FIG. 4 is a top view illustrating a positional relationship between the semiconductor wafer and the grinding stone. A suction stage 12 and a stage cover 13 correspond to the uniaxial grinding stage 8 or the biaxial grinding stage 9. The semiconductor wafer 2 is pasted to the suction stage 12 using a protective tape 14 and rotated toward a predetermined direction at a speed of on the order of 300 rpm, for example. A grinding wheel 16 in which a grinding stone 15 is set slowly comes into contact with the semiconductor wafer 2 from above at a speed of on the order of 4000 rpm to proceed with a grinding process.

Figure 5:
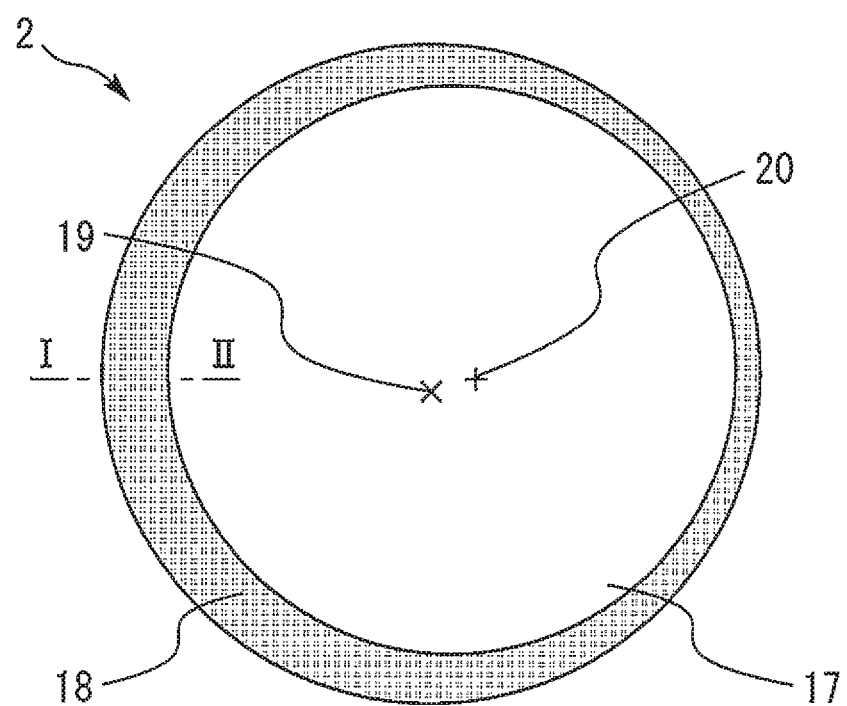
FIG. 5 is a top view illustrating a ribbed wafer.
Figure 6:
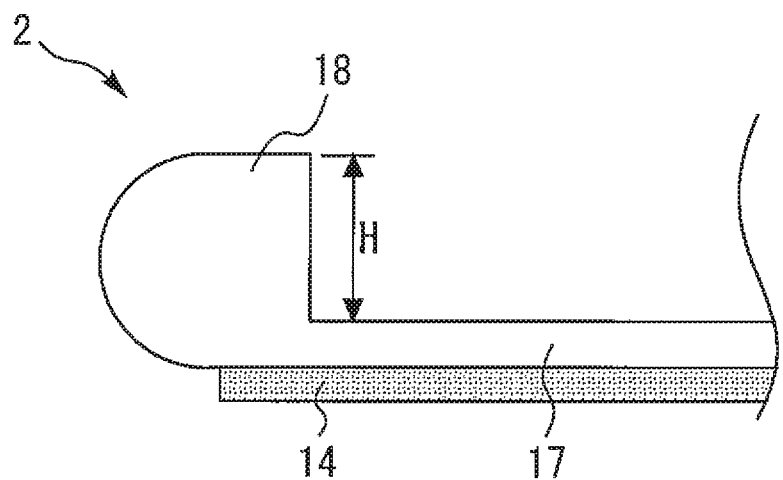
FIG. 6 is a cross-sectional view along I-II of FIG. 5.

FIG. 5 is a top view illustrating a ribbed wafer. FIG. 6 is a cross-sectional view along I-II of FIG. 5. A method of manufacturing this ribbed wafer will be described. First, by grinding a central part of the semiconductor wafer 2, a device region 17 is formed at the central part and a ring-shaped reinforced portion 18 (rib) which is thicker than the device region 17 is formed on an outer circumference of the device region 17. The height of a side wall of a concave portion formed by grinding becomes a height H of the ring-shaped reinforced portion 18.

As a feature of the present embodiment, a center position 19 of the semiconductor wafer 2 is different from a center position 20 of the ring-shaped reinforced portion 18. Note that the center position 19 of the semiconductor wafer 2 is the center of an outer circle of the semiconductor wafer 2. The center position 20 of the ring-shaped reinforced portion 18 is the center of an inner circle of the ring-shaped reinforced portion 18.

Next, the semiconductor wafer 2 is subjected to etching using mixed acid including hydrofluoric acid and nitric acid, and wet treatment such as rinsing using pure water. Next, the semiconductor wafer 2 is rotated and dried. In this case, the center position of the semiconductor wafer 2 is assumed to be the center of rotation.

Since the center position of the semiconductor wafer 2 is different from the center position of the ring-shaped reinforced portion 18, water content can be efficiently drained when rotating and drying the semiconductor wafer 2. As a result, it is possible to prevent foreign substances from staying behind after drying and restrain the generation of stains. Moreover, by grinding the central part of the semiconductor wafer 2, it is possible to easily form the ring-shaped reinforced portion 18 with a high level difference.

Figure 7:
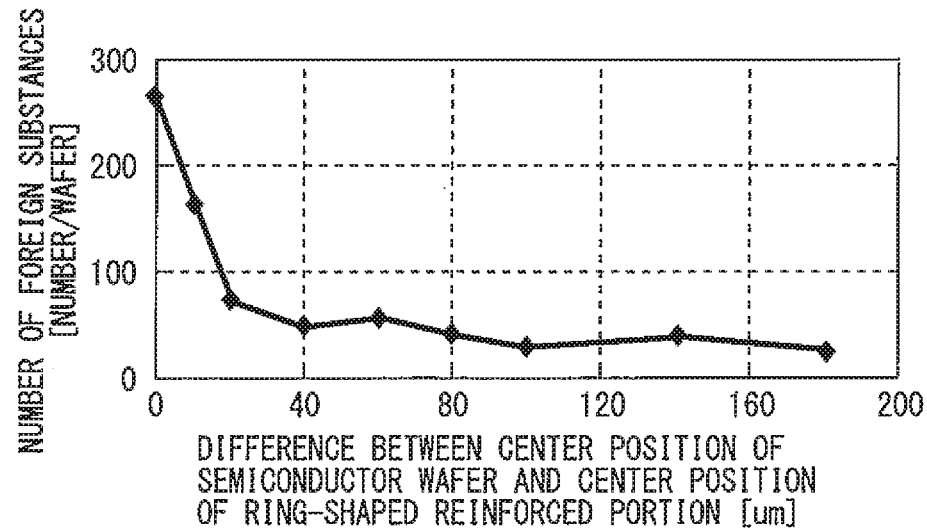
FIG. 7 is a diagram illustrating results of measurement of a relationship between the difference between the center position of the semiconductor wafer and the center position of the ring-shaped reinforced portion, and the number of foreign substances.

FIG. 7 is a diagram illustrating results of measurement of a relationship between the difference between the center position of the semiconductor wafer and the center position of the ring-shaped reinforced portion, and the number of foreign substances. In order to remove a crushed layer formed when grinding a ribbed wafer whose device region 17 has a thickness of 50 μm and whose ring-shaped reinforced portion 18 has a height of 600 μm, the wafer is etched by 20 μm with mixed acid including hydrofluoric acid and nitric acid, and rinsed with pure water. Similarly, the wafer is etched with mixed acid including hydrofluoric acid and nitric acid, and rinsed with pure water. After that, the number of foreign substances of 0.13 μm or more is measured using a foreign substance inspection apparatus (wafer surface inspection apparatus WM-7 manufactured by TOPCON Corporation) using a laser scattering scheme. It has been proved that it is possible to effectively reduce foreign substances after processing by setting the difference between the center position of the semiconductor wafer and the center position of the ring-shaped reinforced portion to 20 μm or more. Therefore, the difference between the center position of the semiconductor wafer 2 and the center position of the ring-shaped reinforced portion 18 is preferably 20 μm or more.

Figure 8:
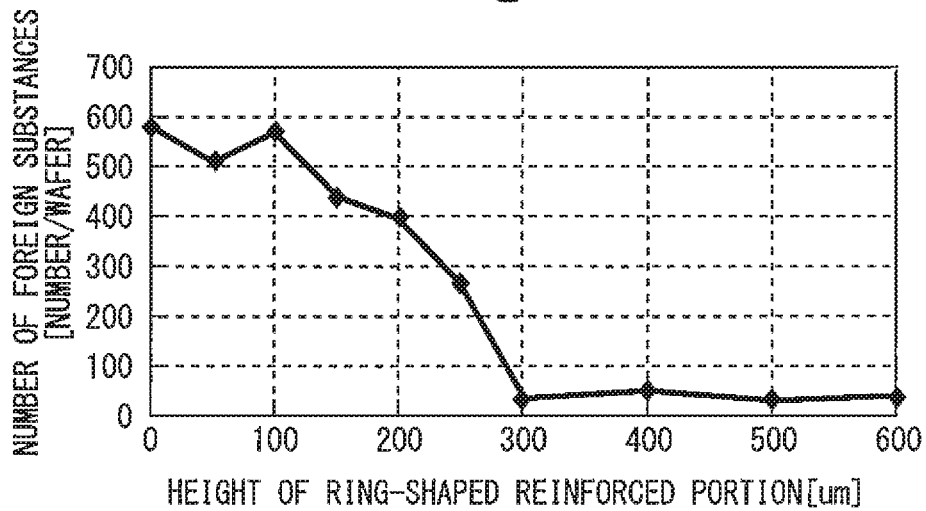
FIG. 8 is a diagram illustrating results of measurement of a relationship between the height of the ring-shaped reinforced portion and the number of foreign substances.

FIG. 8 is a diagram illustrating results of measurement of a relationship between the height of the ring-shaped reinforced portion and the number of foreign substances. A ribbed wafer whose device region 17 has a thickness of 50 μm and whose difference between the center position of the semiconductor wafer 2 and the center position of the ring-shaped reinforced portion 18 is 20 μm is likewise etched with mixed acid including hydrofluoric acid and nitric acid, and rinsed with pure water. After that, the number of foreign substances of 0.13 μm or more is measured using a foreign substance inspection apparatus. It has been proved that when the height of the ring-shaped reinforced portion 18 exceeds 300 μm, foreign substances can be effectively reduced after etching using mixed acid and rinsing with pure water. Therefore, the height of the ring-shaped reinforced portion 18 is preferably set to 300 μm or more.

Embodiment 2

FIG. 9 is a cross-sectional view illustrating a method of manufacturing a semiconductor device according to Embodiment 2 of the present invention. First, as shown in FIG. 9(a), the protective tape 14 is pasted to the surface of the semiconductor wafer 2. Next, the semiconductor wafer 2 is subjected to a thinning process using the back grinder shown in FIG. 2. That is, as shown in FIG. 9(b), the semiconductor wafer 2 is ground using a first grinding stone to form a first concave portion 21. Next, as shown in FIG. 9(c), the interior of the first concave portion 21 is ground using a second grinding stone having a smaller abrasive grain size than the first grinding stone to form a second concave portion 22. The device region 17 and the ring-shaped reinforced portion 18 are formed in this way.

In the present embodiment, the center position of the first concave portion 21 is the center position of the ring-shaped reinforced portion 18. Thus, the ring-shaped reinforced portion 18 of a high level difference can be efficiently formed using the first grinding stone having a large abrasive grain size.

Embodiment 3

FIG. 10 is a cross-sectional view illustrating a method of manufacturing a semiconductor device according to Embodiment 3 of the present invention. First, as shown in FIG. 10(a), the protective tape 14 is pasted to the surface of the semiconductor wafer 2. Next, the semiconductor wafer 2 is subjected to a thinning process using the back grinder shown in FIG. 2. That is, as shown in FIG. 10(b), the semiconductor wafer 2 is ground using a first grinding stone to form the first concave portion 21. Next, as shown in FIG. 10(c), the interior of the first concave portion 21 is ground using a second grinding stone having a smaller abrasive grain size than the first grinding stone to form the second concave portion 22. The device region 17 and the ring-shaped reinforced portion 18 are formed in this way.

In the present embodiment, the center position of the second concave portion 22 is the center position of the ring-shaped reinforced portion 18. For this reason, since the ring-shaped reinforced portion 18 of a high level difference is formed using the second grinding stone having a smaller abrasive grain size, it is possible to reduce the crushed layer introduced by a grinding process and reduce dropping or the like caused by cracking during a wafer process.

DESCRIPTION OF SYMBOLS 2 semiconductor wafer, 17 device region, 18 ring-shaped reinforced portion, 21 first concave portion, 22 second concave portion

The invention claimed is:

1. A method of manufacturing a semiconductor device comprising:
    forming a device region at a central part of a semiconductor wafer and a ring-shaped reinforced portion which is thicker than the device region on an outer circumference of the device region;
    after forming the device region and the ring-shaped reinforced portion, subjecting the semiconductor wafer to wet treatment; and
    after the wet treatment, rotating and drying the semiconductor wafer,
    wherein a center position of the semiconductor wafer is different from a center position of the ring-shaped reinforced portion, and
    the center position of the semiconductor wafer is a center of rotation when rotating and drying the semiconductor wafer.

2. The method of manufacturing a semiconductor device of claim 1, wherein a difference between the center position of the semiconductor wafer and the center position of the ring-shaped reinforced portion is 20 μm or more.

3. The method of manufacturing a semiconductor device of claim 1, wherein the device region and the ring-shaped reinforced portion are formed by grinding the central part of the semiconductor wafer.

4. The method of manufacturing a semiconductor device of claim 3, wherein the semiconductor wafer is ground using a first grinding stone to form a first concave portion and an interior of the first concave portion is ground using a second grinding stone having a smaller abrasive grain size than the first grinding stone to form a second concave portion so that the device region and the ring-shaped reinforced portion are formed.

5. The method of manufacturing a semiconductor device of claim 4, wherein a center position of the first concave portion is the center position of the ring-shaped reinforced portion.

6. The method of manufacturing a semiconductor device of claim 4, wherein a center position of the second concave portion is the center position of the ring-shaped reinforced portion.

7. The method of manufacturing a semiconductor device of claim 1, wherein height of the ring-shaped reinforced portion is 300 μm or more.

* * * * *